United States Patent

[11] 3,632,972

[72] Inventor William M. Halstead
P.O. Box 881, Glen Burnie, Md. 21061

[21] Appl. No. 862,165
[22] Filed Sept. 30, 1969
[45] Patented Jan. 4, 1972

[54] TIP FOR OPENING EYELET HOLES IN PRINTED CIRCUIT BOARDS
5 Claims, 2 Drawing Figs.

[52] U.S. Cl. .......... 219/229, 15/104 R, 30/140, 30/366, 83/170, 134/5, 219/239, 228/19
[51] Int. Cl. .......... B23k 3/02, H05b 1/00
[50] Field of Search .......... 219/221–242, 533; 228/51–55, 19; 30/140, 164.8, 164.5, 366, 367, 368; 15/104 R; 83/170, 171; 134/5

[56] References Cited

UNITED STATES PATENTS

| | | | |
|---|---|---|---|
| 3,050,612 | 8/1962 | Eversole | 219/233 |
| 3,080,842 | 3/1963 | Rice | 228/54 |
| 159,273 | 2/1875 | Lindley | 30/164.8 |
| 743,893 | 11/1903 | Lancaster | 30/140 X |
| 1,094,569 | 4/1914 | Hughes | 30/164.8 X |
| 1,305,711 | 6/1919 | Gilchrist | 30/164.8 X |
| 1,855,475 | 4/1932 | Covey | 219/229 |
| 2,382,032 | 8/1945 | Stone et al. | 30/164.5 X |
| 2,974,717 | 3/1961 | Lindsay | 219/229 UX |
| 3,013,930 | 12/1961 | Serbin | 219/229 UX |

FOREIGN PATENTS

| | | | |
|---|---|---|---|
| 1,564,832 | 3/1969 | France | 219/228 |
| 62,114 | 4/1944 | Norway | 15/104 R |
| 561,595 | 5/1944 | Great Britain | 30/140 |
| 448,120 | 5/1949 | Italy | 30/366 |
| 242,587 | 10/1946 | Switzerland | 30/140 |

OTHER REFERENCES

" Solder Melting Device" by Claude P. Baumann; RCA Technical Notes; RCA T.N. No.; 462; Sept. 1961;

*Primary Examiner*—A. Bartis
*Attorneys*—Munson H. Lane and Munson H. Lane, Jr.

ABSTRACT: A shank adapted to be connected to and heated by a soldering iron carries at least one comblike member of heat conductive material, including a row of tapered, pointed prongs which are insertable in a row of solder-plugged eyelet holes in a printed circuit board so as to melt the solder and open up the holes for subsequent installation of wire leads of an electrical component such as an integrated circuit module. The material of the comblike member, including its prongs, is such that solder does not readily adhere thereto.

PATENTED JAN 4 1972 3,632,972

INVENTOR
William M. Halstead

BY Munson H. Lane
ATTORNEY

TIP FOR OPENING EYELET HOLES IN PRINTED CIRCUIT BOARDS

This invention relates to new and useful improvements in special tools for use in the electronic industry, and the principal object of the invention is to provide a special soldering iron tip which may be easily and effectively utilized for opening solder-plugged eyelet holes in printed circuit boards.

The eyelet holes in a printed circuit board accommodate wire leads of electrical components such as integrated circuit modules which are mounted on the board, such wire leads being arranged on the module in a row, or very often in two parallel rows, to fit into a complementally arranged row or rows of eyelet holes in the board. During installation of the module the wire leads are inserted into the eyelet holes and soldered. When a module becomes defective or for some other reason has to be replaced, the wire leads must be unsoldered before they can be withdrawn from the eyelet holes, and when this is done, some of the solder remains and hardens in the holes, thus plugging the same so that the wire leads of a replacement module cannot be inserted into the holes until the solder is removed.

It has been customary in the art to unplug the eyelet holes by the use of a solder melting tool in conjunction with a solder sucker which removed the melted solder from the holes by suction. While this procedure was generally satisfactory, it required the use of a special sucking tool and a vacuum pump not always readily available.

The present invention eliminates the need for a sucking tool and vacuum pump by the provision of a simple tip which is attachable to a conventional soldering iron and carries a comblike member having tapered prongs arranged in a row so that, when heated, they may be inserted into the eyelet holes to melt the solder therein and push the molten solder outwardly, thus leaving the holes free and open when the prongs are withdrawn therefrom. The prongs are made of material to which solder does not readily adhere, and thus assurance is had that the eyelet holes remain open after withdrawal of the prongs.

Figure 1:
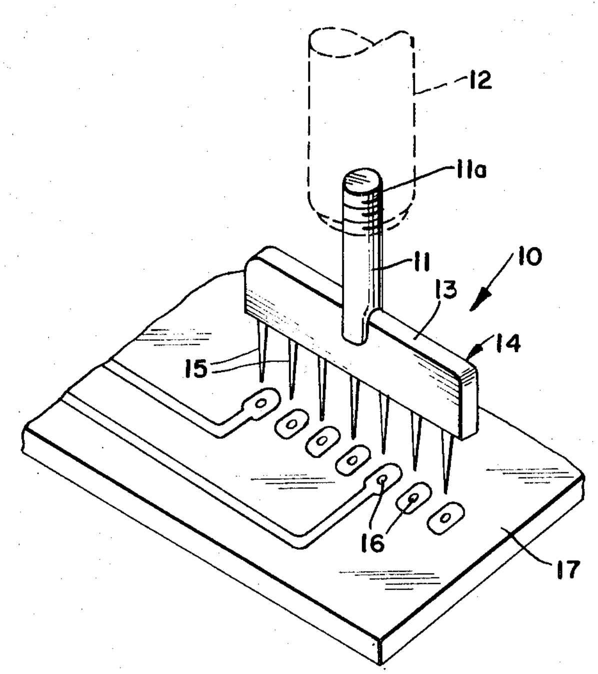
Figure 2:
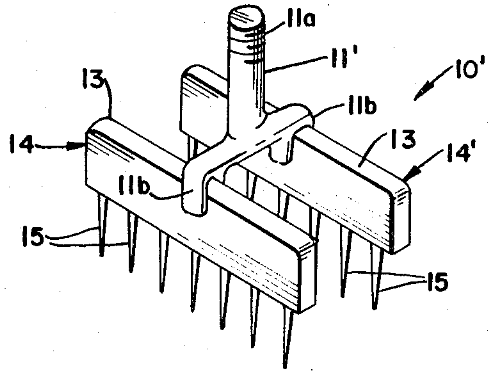

With the foregoing more important object and features in view, the invention will be understood from the following description taken in conjunction with the accompanying drawings, wherein like characters of reference are used to designate like parts, and wherein:

FIG. 1 is a perspective view showing one embodiment of the soldering iron tip of the invention in relation to eyelet holes in a printed circuit board; and FIG. 2 is a perspective view showing a modified embodiment of the tip, utilizing two comblike members to provide two rows of hole-opening prongs.

Referring now to the accompanying drawings in detail, FIG. 1 shows one embodiment of the tip of the invention designated generally by the reference numeral 10. The same comprises a shank 11 having a screw-threaded end portion 11*a* adapted to be connected to and heated by a conventional soldering iron, a portion of which is indicated by the dotted lines 12.

The other end of the shank 11 is suitably secured to a rigid back bar 13 of a comblike member 14 which also includes a row of longitudinally tapered, pointed prongs 15. The prongs 15 are preferably formed integrally with the back bar 13 from any suitable heat-conductive material to which solder does not readily adhere, as for example stainless steel or aluminum. The prongs project from one edge of the back bar in a row disposed in a plane which is substantially parallel to the axis of the shank 11, as will be readily apparent.

When the tip of the invention is placed in use, it is attached to a soldering iron and heated to a temperature sufficient to melt solder, whereupon the pointed extremities of the prongs 15 are applied to the solder-plugged eyelet holes 16 in a printed circuit board 17. This causes the solder in the holes to melt and as the operator gradually applies pressure to the tool, the prongs 15 are caused to slide into and through the holes 16, thus ejecting the molten solder from the holes and leaving the holes free and open when the prongs are subsequently withdrawn from the board.

It is preferred to apply the tool to the side of the board 17 on which an integrated circuit module is to be installed, that is, on the side of the board opposite from that where the wire leads of the module are normally soldered, which may be referred to as the underside of the board. Thus, when the prongs 15 push the molten solder outwardly from the holes to the underside of the board and the pushed out solder surrounds the projecting prongs without adhering thereto, the prongs can be withdrawn while the pushed out solder remains and hardens in the form of rings or eyelets around the holes at the underside of the board. In other words, it is an important feature of the invention that, because the solder does not adhere to the prongs, it does not get pulled back into the holes during withdrawal of the prongs from the board, and thus the holes are left free and open while the pushed out solder remains on the underside of the board in the form of rings or eyelets surrounding the holes, in readiness for the next soldering operation when the wire leads of a replacement module are inserted into the open holes and into the rings or eyelets formed by the pushed out solder. Thus, with the solder rings or eyelets already on the underside of the board, the replacement module may be quickly soldered in place, usually without any additional solder being required for that procedure, although additional solder may be used, if desired or necessary.

The tool of the invention as shown in FIG. 1 utilizes a single row of prongs 15 for simultaneously opening up a corresponding single row of holes in the board 17. However, in many instances integrated circuit modules are provided with multiple rows of wire leads insertable in corresponding multiple rows of eyelet holes in the board, and since it is obviously desirable to open up all the necessary holes at the same time, a modified tip 10' shown in FIG. 2 may be used.

The tip 10' utilizes a pair of comblike members 14, 14' of identical construction, carried by the furcations 11*b* of a bifurcated lower end portion of the shank 11', the members 14, 14' being disposed in spaced parallel juxtaposition so that their two rows of prongs 15 may be applied to two rows of holes in the board.

What is claimed as new is:

1. A soldering iron tip for simultaneously opening a row of spaced solder-plugged eyelet holes in a printed circuit board comprising a shank adapted to be connected to and heated by a soldering iron, and a comblike member of heat-conductive material carried by said shank, said comblike member including a rigid back bar secured to the shank and a row of prongs provided integrally along one edge of said back bar, said prongs being spaced apart a distance corresponding to the spacing of said holes, and being formed of a material to which solder does not readily adhere, said prongs being further characterized in that they are longitudinally tapered and terminate in pointed extremities.

2. The device as defined in claim 1 which is further characterized in that said prongs project from said back bar in a plane parallel to the axis of said shank.

3. The device as defined in claim 1 which also includes a second comblike member identical to the first mentioned comblike member and disposed in spaced parallel juxtaposition relative thereto, said shank including a bifurcated portion by the furcations of which the respective first and second comblike members are carried.

4. The device as defined in claim 1 wherein the material from which said prongs are formed is aluminum.

5. The device as defined in claim 1 wherein the material from which said prongs are formed is stainless steel.

* * * * *